United States Patent
Sun et al.

(10) Patent No.: US 10,991,634 B2
(45) Date of Patent: *Apr. 27, 2021

(54) METHOD AND SYSTEM FOR MANUFACTURING SOLAR CELLS AND SHINGLED SOLAR CELL MODULES

(71) Applicant: Chengdu Yefan Science and Technology Co., Ltd., Sichuan (CN)

(72) Inventors: Jun Sun, Hefei (CN); Bingwei Yin, Hefei (CN); Shiyin Ding, Hefei (CN); Fushen Zhou, Hefei (CN)

(73) Assignee: CHENGDU YEFAN SCIENCE AND TECHNOLOGY CO., LTD., Sichuan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/039,917

(22) Filed: Sep. 30, 2020

(65) Prior Publication Data

US 2021/0020526 A1 Jan. 21, 2021

Related U.S. Application Data

(63) Continuation of application No. 16/553,111, filed on Aug. 27, 2019, now Pat. No. 10,825,742, which is a
(Continued)

(30) Foreign Application Priority Data

Nov. 23, 2018 (CN) .......................... 201811410350.X

(51) Int. Cl.
*H01L 21/66* (2006.01)
*B23K 26/53* (2014.01)
(Continued)

(52) U.S. Cl.
CPC .............. *H01L 22/20* (2013.01); *B23K 26/53* (2015.10); *H01L 31/02168* (2013.01);
(Continued)

(58) Field of Classification Search
CPC ............... H01L 22/20; H01L 31/02168; H01L 31/022425; H01L 31/022466;
(Continued)

(56) References Cited

U.S. PATENT DOCUMENTS 9,935,221 B1 * 4/2018 Zhou ........................ H02S 40/34
9,935,222 B1 4/2018 Zhou et al.
(Continued)

FOREIGN PATENT DOCUMENTS

CN 104201240 A 12/2014
CN 103400905 B 2/2016
(Continued)

OTHER PUBLICATIONS

IP Australia, Examination Report No. 3, AU Patent Application No. 2018409644, dated Apr. 6, 2020, six pages.
(Continued)

*Primary Examiner* — Shahed Ahmed
(74) *Attorney, Agent, or Firm* — Fenwick & West LLP

(57) ABSTRACT

The present disclosure provides a method and system for manufacturing solar cells and shingled solar cell modules. The method as provided by the present disclosure includes performing scribing and dividing of the solar cells, sorting the obtained solar cell strips, and packaging the cell strips in the solar cell manufacturing process. The solar cell strips can be assembled directly after dismantling the package in the solar module manufacturing process. Therefore, the method can accomplish a smooth flow of manufacturing solar cells and shingled solar cell modules, reduce repeated processing steps, lower the risk of cracking and costs thereof, and
(Continued)

optimize the current matching and the color consistency of the cell strips in the shingled solar cell modules.

5 Claims, 5 Drawing Sheets

Related U.S. Application Data continuation of application No. PCT/CN2018/119526, filed on Dec. 6, 2018.

(51) Int. Cl.
| | |
|---|---|
| H01L 31/0216 | (2014.01) |
| H01L 31/0224 | (2006.01) |
| H01L 31/0236 | (2006.01) |
| H01L 31/068 | (2012.01) |
| H01L 31/20 | (2006.01) |

(52) U.S. Cl.
CPC ............ *H01L 31/02363* (2013.01); *H01L 31/022425* (2013.01); *H01L 31/022466* (2013.01); *H01L 31/068* (2013.01); *H01L 31/202* (2013.01); *H01L 31/206* (2013.01); *H01L 31/208* (2013.01)

(58) Field of Classification Search
CPC ............ H01L 31/02363; H01L 31/068; H01L 31/202; H01L 31/206; H01L 31/208; H01L 31/00–208; H01L 31/186; H01L 31/18; H01L 31/1876; B23K 26/53; H02S 50/00–15
See application file for complete search history.

(56) References Cited

U.S. PATENT DOCUMENTS

| | | | |
|---|---|---|---|
| 10,825,742 B2 | 11/2020 | Sun et al. | |
| 2009/0120488 A1* | 5/2009 | Gorog | H01L 31/055 136/247 |
| 2010/0136715 A1* | 6/2010 | Sopori | H01L 31/18 438/14 |
| 2012/0013897 A1 | 1/2012 | Lai | |
| 2012/0313661 A1 | 12/2012 | Jungwirth et al. | |
| 2014/0326295 A1* | 11/2014 | Moslehi | H01L 31/048 136/249 |
| 2016/0163913 A1* | 6/2016 | Gonzalez | H01L 31/1876 29/846 |
| 2017/0207354 A1 | 7/2017 | Lee et al. | |
| 2018/0138338 A1* | 5/2018 | Pretorius | H01L 31/048 |
| 2018/0175233 A1 | 6/2018 | Reddy et al. | |
| 2018/0277693 A1 | 9/2018 | Naber | |

FOREIGN PATENT DOCUMENTS

| | | |
|---|---|---|
| CN | 105895738 A | 8/2016 |
| CN | 106206858 A | 12/2016 |
| CN | 106816496 A | 6/2017 |
| CN | 108428641 A | 8/2018 |
| CN | 207705205 U | 8/2018 |
| CN | 108574025 A | 9/2018 |
| CN | 108807575 A | 11/2018 |
| EP | 0111394 A2 | 6/1984 |
| EP | 2214215 A1 | 8/2010 |
| JP | 2012-043870 A | 3/2012 |
| JP | 2014-220346 A | 11/2014 |
| JP | 2015-532787 A | 11/2015 |
| JP | 2017-517145 A | 6/2017 |
| JP | 2018-152561 A | 9/2018 |
| KR | 10-2013-0048975 A | 5/2013 |
| KR | 10-2013-0061346 A | 6/2013 |
| KR | 10-2016-0090084 A | 7/2016 |
| KR | 10-2017-0057177 A | 5/2017 |
| WO | WO 2010/135321 A2 | 11/2010 |
| WO | WO 2014/035538 A1 | 3/2014 |
| WO | WO 2015/183827 A2 | 12/2015 |
| WO | WO 2017/163498 A1 | 9/2017 |
| WO | WO 2018/009974 A1 | 1/2018 |
| WO | WO 2018/023103 A1 | 2/2018 |
| WO | WO 2018/147739 A1 | 8/2018 |
| WO | WO 2018/166598 A1 | 9/2018 |

OTHER PUBLICATIONS

IP Australia, Examination Report No. 1, AU Patent Application No. 2018409644, dated Sep. 30, 2019, eight pages.
Korean Intellectual Property Office, Office Action, KR Patent Application No. 10-2019-7015897, dated Oct. 14, 2019, 13 pages (with concise explanation of relevance).
PCT International Search Report and Written Opinion, PCT Application No. PCT/CN2018/119526, dated Aug. 22, 2019, nine pages.
United States Office Action, U.S. Appl. No. 16/553,111, dated May 27, 2020, 11 pages.
United States Office Action, U.S. Appl. No. 16/553,111, dated Feb. 4, 2020, ten pages.
European Patent Office, Extended European Search Report and Opinion, EP Patent Application No. 18899028.7, dated Jan. 22, 2020, 11 pages.
IP Australia, Examination Report No. 4, AU Patent Application No. 2018409644, dated Aug. 26, 2020, six pages.
Japan Patent Office, Office Action, JP Patent Application No. 2019-530094, dated Nov. 2, 2020, ten pages.
SINO Voltaics, "Solar Cell Sorting: Process and Purpose," Mar. 16, 2017, five pages, [Online] [Retrieved on Aug. 18, 2020] Retrieved from the Internet <URL: https://sinovoltaics.com/learning-center/manufacturing/solar-cell-sorting-process-and-purpose/>.
United States Office Action, U.S. Appl. No. 17/039,905, dated Dec. 8, 2020, ten pages.

* cited by examiner

METHOD AND SYSTEM FOR MANUFACTURING SOLAR CELLS AND SHINGLED SOLAR CELL MODULES

CROSS REFERENCE TO RELATED APPLICATIONS

This application is a continuation of co-pending U.S. application Ser. No. 16/553,111, filed Aug. 27, 2019, which is a continuation of International Application No. PCT/CN2018/119526, filed on Dec. 6, 2018, which claims priority from Chinese Application No. 201811410350.X, filed on Nov. 23, 2018. All of the abovementioned applications are hereby incorporated by reference in their entirety.

FIELD

The present disclosure generally relates to the field of manufacturing and application of crystalline silicon shingled solar cell modules, and more specifically, to a method and system for manufacturing solar cells and shingled solar cell modules.

BACKGROUND

With rapid technological progress and economic development in the global range, traditional fossil fuels, such as coal, oil, natural gas, and the like, are depleting at a rapid pace, causing deterioration of the ecological environment, and there arises a need of demanding more clean energy sources, accordingly. Due to excellent performance in reliability, safety, wide application, environment-friendliness and adequacy, the solar energy has become one of the most important renewable resources, and the solar (photovoltaic) industry has gained widespread global popularity in many countries and areas.

The solar cell is a device for converting light energy into electrical energy as a result of photoelectric effect, the most common example of which is a crystalline silicon cell. Given that the solar module is a core component for photovoltaic power generation, it is a trend to develop efficient modules for improving the conversion efficiency. As compared with the legacy solar module, a shingled solar cell module, which is an efficient, dense shingling-technology based solar module, allows a bus bar at a front side of a cell to overlap the counterpart at a back side of a further cell, in a fashion of interconnecting the solar cells more closely, thereby minimizing the gaps between cells and reducing the inefficient space for power generation resulting from the gaps between cells. Therefore, it is possible to place more cells in the same area, enlarge the light absorption area, and improve the conversion efficiency of the solar module.

A shingled solar cell module is typically formed by scribing a solar cell and dividing the solar cell into strips and bonding the same with conductive adhesive and then encapsulating them. The existing shingled solar cell module of prior art is typically manufactured through the legacy process flow of solar cells and modules. That is, in a cell manufacturing process of a solar cell factory, the entire cell is produced, and in a module manufacturing process of a solar module factory, the solar cell is scribed and divided into cell strips, and the cell strips are encapsulated into a shingled solar cell module through a shingling procedure. This process flow is unable to meet requirements on efficient sorting, and brings about repeated testing. The main reason lies in the inconsistencies of the cell strips resulting from intra-cell differences during the cell manufacturing process. Thus, in addition to testing and sorting performed for the entire sheet of the cell during the cell manufacturing process, a cell strip sorting step is required in the module manufacturing process. The repeated testing and sorting cause high labor intensity, higher costs and an increasing cracking risk.

Accordingly, there is a need of improving the method and system for manufacturing solar cells and shingled solar cell modules.

SUMMARY

In view of the problems existing in the prior art, the present disclosure provides a method and system for manufacturing solar cells and shingled solar cell modules.

In an aspect, the present disclosure provides a method of manufacturing a solar cell, wherein, the method comprises: scribing the solar cell and dividing the solar cell into a plurality of solar cell strips in a cell manufacturing process, and testing and sorting the plurality of solar cell strips in the cell manufacturing process.

According to a preferable embodiment of the present disclosure, the method comprises:
a pretreatment step, in which a wafer is pretreated;
a screen-printing step, in which a precious metal paste is screen-printed on a surface of the pretreated wafer;
a sintering and curing step, in which the screen-printed wafer is sintered and cured to form a solar cell;
a scribing and dividing step, in which the solar cell is scribed and divide into a plurality of solar cell strips; and
a post-treatment step, in which the plurality of solar cell strips are post-treated respectively.

According to a preferable embodiment of the present disclosure, the pretreatment step comprises:
a texturization step, in which the surfaces of the wafer are textured;
a junction diffusion step, in which the wafer is junction diffused to form PN junctions in the wafer;
an etching step, in which the PN junctions at edges of the wafer are removed by etching; and
a coating step, in which one or more anti-reflection films are deposited on a front side of the wafer, and a back passivation film is deposited on a back side of the wafer.

According to another preferable embodiment of the present disclosure, the pretreatment step comprises:
a texturization step, in which the surfaces of the wafer are textured; and
a coating step, in which amorphous silicon is deposited on surfaces of the wafer, and a transparent conductive oxide film is deposited on surfaces of the amorphous silicon.

According to a further preferable embodiment of the present disclosure, the pretreatment step comprises:
a texturization step, in which the surfaces of the wafer are textured;
a junction diffusion step, in which a p-type layer is diffused in a front side of the wafer to form PN junctions in the wafer;
an etching step, in which the p-type layer at a back side and edges of the wafer and impurities on the surfaces of the wafer formed during junction diffusion are removed by etching;
a tunnel oxide layer and multicrystalline silicon layer preparing step, in which a silicon dioxide layer is formed on the back side of the wafer, and a multicrystalline silicon layer is formed on the silicon dioxide layer;
an ion implanting step, in which phosphorus atoms are implanted, by ion implanting, into the multicrystalline silicon layer;

an annealing step, in which the implanted phosphorus atoms are activated by annealing; and a coating step, in which a first layer of film is deposited on the front side of the wafer, and then a second layer of film is deposited on the front and back sides of the wafer.

According to a preferable embodiment of the present disclosure, residue liquid from the texturization step is cleaned before the junction diffusion step.

According to a preferable embodiment of the present disclosure, the PN junctions formed at the edges of the wafer are removed at the etching step by plasma etching.

According to a preferable embodiment of the present disclosure, silicon phosphate glass on surfaces of the wafer formed at the junction diffusion step is removed before the coating step.

According to a preferable embodiment of the present disclosure, the anti-reflection film comprises a silicon nitride anti-reflection film.

According to a preferable embodiment of the present disclosure, residue liquid from the texturization step is cleaned before the coating step.

According to a preferable embodiment of the present disclosure, surfaces of the wafer are cleaned with a chemical solution before the coating step.

According to a preferable embodiment of the present disclosure, boron tribromide is diffused on the front side of the wafer at the junction diffusion step to form a p-type layer.

According to a preferable embodiment of the present disclosure, etching is performed with acid at the etching step, and the impurities are borosilicate glass.

According to a preferable embodiment of the present disclosure, the silicon dioxide layer has a thickness of 1 nm-2 nm, and the multicrystalline silicon layer has a thickness of 100 nm-200 nm.

According to a preferable embodiment of the present disclosure, the first layer of film is an aluminum oxide film, and the second layer of film is a silicon nitride film.

According to a preferable embodiment of the present disclosure, the post-treatment step comprises performing testing and sorting and appearance inspection on the plurality of solar cell strips.

According to a preferable embodiment of the present disclosure, the scribing and dividing step comprises physical scribing and chemical scribing.

According to a preferable embodiment of the present disclosure, the scribing and dividing step comprises laser scribing.

According to a preferable embodiment of the present disclosure, the scribing and dividing step comprises linear scribing.

According to a preferable embodiment of the present disclosure, laser scribing is performed at a side of the solar cell away from the surface having the PN junctions.

According to a preferable embodiment of the present disclosure, the testing and sorting comprise an electrical performance testing and an electroluminescence testing.

According to a preferable embodiment of the present disclosure, the appearance inspection comprises an appearance visual testing and color sorting.

According to a preferable embodiment of the present disclosure, the solar cell strips are graded after post-treated.

In another aspect, the present disclosure provides a method of manufacturing a shingled solar cell module, the method comprises:
receiving the solar cell strips manufactured with the method according to the above embodiments; and
forming, by a shingling process, the shingled solar cell module from the solar cell strips.

In a further aspect, the present disclosure provides a system for manufacturing a solar cell, the system comprises:
pretreatment devices for pretreating a wafer;
a screen-printing device for receiving the wafer output by the pretreatment devices, and screen-printing a precious metal paste onto surfaces of the pretreated wafer;
a sintering and curing device for receiving the wafer output by the sintering and curing device, and sintering and curing the wafer to form the solar cell;
a scribing and dividing device for receiving the solar cell output by the sintering and curing device, and scribing and dividing the solar cell to form a plurality of solar cell strips; and
post-treatment devices for receiving the plurality of solar cell strips output by the scribing and dividing device, and post-treating the plurality of solar cell strips, respectively.

According to a preferable embodiment of the present disclosure, the pretreatment devices comprise:
a texturization device for texturizing the surfaces of the wafer;
a junction diffusion device for receiving the wafer output by the texturization device, and junction diffusion the wafer to form PN junctions therein;
an etching device for receiving the wafer output by the junction diffusion device, and removing, by etching, the PN junctions at edges of the wafer; and
a coating device for receiving the wafer output by the etching device, depositing one or more anti-reflection films on a front side of the wafer, and depositing a back passivation film on a back side of the wafer.

According to a preferable embodiment of the present disclosure, the pretreatment devices comprise:
a texturization device for texturizing the surfaces of the wafer; and
a coating device for receiving the wafer output by the texturization device, depositing amorphous silicon on the surfaces of the wafer, and depositing a transparent conductive oxide film on surfaces of the amorphous silicon.

According to a preferable embodiment of the present disclosure, the pretreatment devices comprise:
a texturization device for texturizing the surfaces of the wafer;
a junction diffusion device for receiving the wafer output by the texturization device, and diffusion a p-type layer on a front surface of the wafer to form PN junctions in the wafer;
an etching device for receiving the wafer output by the junction diffusion device, and removing the p-type layer at a back side and edges of the wafer and impurities on the surfaces of the wafer formed in the junction diffusion device;
a tunnel oxide layer and multicrystalline silicon layer preparing device for receiving the wafer output by the etching device, forming a silicon dioxide layer on the back side of the wafer, and forming a multicrystalline silicon layer on the silicon dioxide layer;
an ion implanting device for receiving the wafer output by the tunnel oxide layer and multicrystalline silicon layer preparing device, and implanting phosphorus atoms into the multicrystalline silicon layer;
an annealing device for receiving the wafer output by the ion implanting device, and activating the implanted phosphorus atoms by annealing; and
a coating device for receiving the wafer output by the annealing device, depositing a first layer of film on a front side of the wafer, and then depositing a second layer of film on the front side and back side of the wafer.

According to a preferable embodiment of the present disclosure, the post-treatment devices comprise a device for performing testing and sorting on the plurality of solar cell strips, and a device for appearance inspection.

According to a preferable embodiment of the present disclosure, the scribing and dividing device comprises physical scribing device and chemical scribing device.

According to a preferable embodiment of the present disclosure, the scribing and dividing device comprises laser scribing device.

According to a preferable embodiment of the present disclosure, the scribing and dividing device comprises linear scribing device.

According to a preferable embodiment of the present disclosure, the scribing and dividing device performs laser scribing at one side of the solar cell away from the PN junctions.

According to a preferable embodiment of the present disclosure, the etching device comprises plasma etching device.

According to a preferable embodiment of the present disclosure, the anti-reflection film comprises a silicon nitride anti-reflection film.

According to a preferable embodiment of the present disclosure, the etching device comprises acid etching device.

According to a preferable embodiment of the present disclosure, the tunnel oxide layer and multicrystalline silicon layer preparing device comprises a low pressure chemical vapor deposition device for forming a silicon dioxide layer with a thickness of 1 nm-2 nm on the back side of the wafer, and a multicrystalline silicon layer with a thickness of 100 nm-200 nm on the silicon dioxide layer.

According to a preferable embodiment of the present disclosure, the coating device deposits an aluminum oxide film on the front side of the wafer, and then depositing a silicon nitride film on the front and back sides of the wafer.

According to a preferable embodiment of the present disclosure, the device for performing testing and sorting on the plurality of solar cell strips comprises electrical performance testing device and electroluminescence testing device.

According to a preferable embodiment of the present disclosure, the device for performing appearance inspection on the plurality of solar cell strips comprises appearance visual testing device and color sorting device.

The method of manufacturing a solar cell and a solar module as provided by the present disclosure includes performing scribing and dividing of the solar cells, sorting the obtained solar cell strips, and packaging the cell strips in the cell manufacturing process. The cell strips can be shingling assembled directly after dismantling the package in the module manufacturing process. Hence, the method can accomplish a smooth flow of manufacturing the solar cells and the shingled solar cell modules, reduce repeated processing steps, lower the cracking risk and costs thereof, and optimize the current matching and the appearance color consistency of the cell strips in the shingled solar cell modules.

DETAILED DESCRIPTION OF EMBODIMENTS

Hereinafter, the method and system for manufacturing solar cells and shingled solar cell modules according to the present disclosure will be described in detail with reference to the accompanying drawings. The embodiments described herein are the preferable embodiments according to the present disclosure, and those skilled in the art would envision, on the basis of the preferable embodiments described, other manners capable of implementing the present disclosure, which also fall within the scope of the present disclosure.

Figure 1:
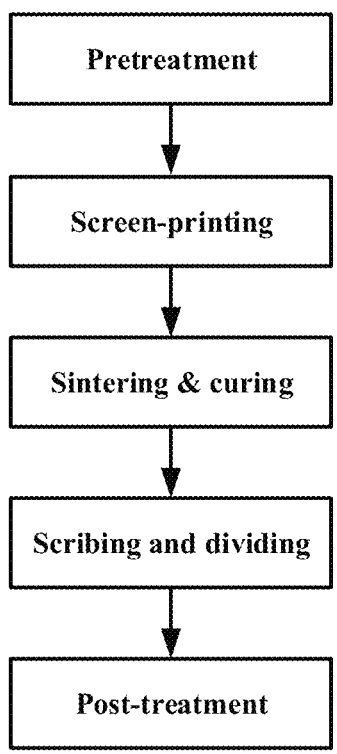
FIG. 1 illustrates a method of manufacturing a solar cell according to a preferable embodiment of the present disclosure.
Figure 2A:
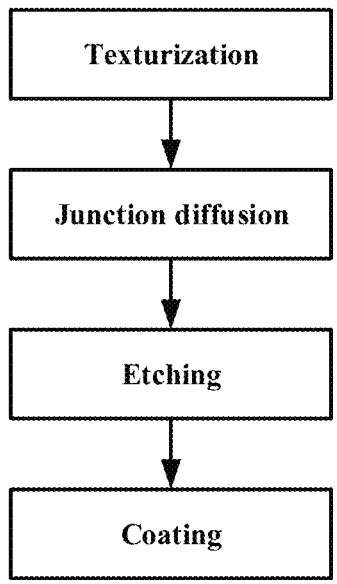
FIG. 2A illustrates a pretreatment step of manufacturing a solar cell according to a preferable embodiment of the present disclosure.

FIG. 1 illustrates a method of manufacturing a solar cell according to a preferable embodiment of the present disclosure. As shown, the method mainly includes steps of pretreatment, screen-printing, sintering curing, scribing and dividing, and post-treatment. Wherein, the pretreatment step may be varied with different types of cells, and for conventional cells, the pretreatment step, as shown in FIG. 2A, mainly includes:

A texturization step: the surfaces of a monocrystalline/multicrystalline silicon wafer are textured to obtain a good texturization and thus the surface area of the wafer is increased, so as to receive more photons (i.e., energy) while reducing reflection of the incident light.

Alternatively, the residue liquid generated during texturization can be cleaned thereafter, to reduce impacts of acid and alkaline substances on cell junctions.

A junction diffusion step: through reaction of, for example, phosphorus oxychloride with the wafer, phosphorus atoms are obtained. Over a period of time, the phosphorus atoms enter into the surface layer of the wafer, and form an interface between an n-type semiconductor and a p-type semiconductor, by means of permeation and diffusion into the wafer via gaps between silicon atoms, or by means of ion implantation, and the junction diffusion procedure is completed, thereby converting the light energy into the electric energy. It would be appreciated that other types of junction-making are also feasible.

Considering that a phosphosilicate glass layer may be formed on the wafer surface in the junction diffusion procedure, a phosphosilicate glass removal procedure is optional to reduce impacts on the efficiency of the solar cell.

An etching step: given that a short circuit channel is formed by junction diffusion at the wafer edges, photogenerated electrons collected at the front side of the PN junctions flow along the area at the edge where phosphorous is diffused to the back side of the PN junctions, causing short circuit. Therefore, it is required to remove the PN junctions at the edges by etching, for example, plasma etching, so as to avoid short circuit at the edges.

A coating step: in order to reduce surface reflection of the wafer and improve the conversion efficiency, it is required to deposit one or more layers of silicon nitride anti-reflection film on a surface at one side of the wafer, and the anti-reflection film can be prepared by, for example, plasma enhanced chemical vapor deposition (PEVCD) procedure.

In order to achieve a good passivation effect, a rear passivation film may be deposited on the surface at the opposite side of the cells to reduce the recombination of carriers.

Figure 2B:
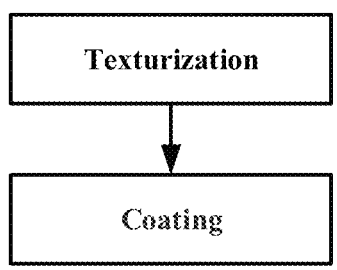
FIG. 2B illustrates a pretreatment step of manufacturing a solar cell according to another preferable embodiment of the present disclosure.

The above pretreatment steps are described in connection with the manufacturing process of legacy solar cells. It would be appreciated that a corresponding preparation process can be employed as a substitute, for other p-types, n-types, and other types of cells, for example, an ordinary mono/multi crystalline silicon cell, a passivated emitter rear contact (PERC) cell, a heterojunction (HJT) cell, a tunnel oxide passivated contact (TopCon) cell or the like. For example, as shown in FIG. 2B, the pretreatment step in a manufacturing process of a heterojunction cell mainly include:

A texturization step: the surfaces of a monocrystalline/multicrystalline silicon wafer are textured to obtain a good textured structure and thus increase the surface area of the wafer, so as to receive more photons while reducing reflection of the incident light.

Alternatively, the residue liquid generated during texturization can be cleaned thereafter, to reduce impacts of acid and alkaline substances on battery junction.

A coating step: the amorphous silicon is deposited on both surfaces of the wafer, and then transparent conductive oxide (TCO) films are deposited on the surfaces of the amorphous silicon respectively.

Figure 2C:
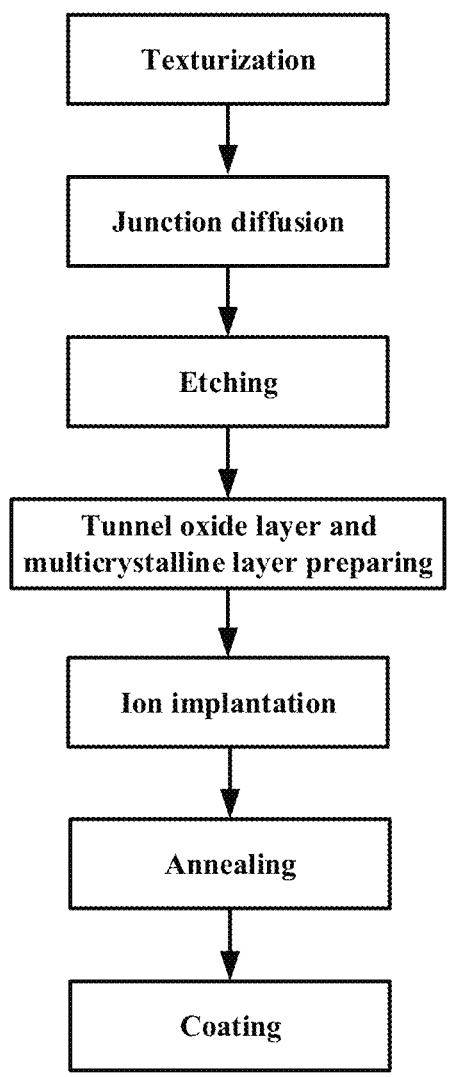
FIG. 2C illustrates a pretreatment step of manufacturing a solar cell according to a further preferable embodiment of the present disclosure.

A preparation process of a tunnel oxide passivated contact (TopCon) cell, as shown in FIG. 2C, mainly includes:

A texturization step: the surfaces of a monocrystalline/multicrystalline silicon wafer is textured to obtain a good textured structure and thus increase the surface area of the wafer, so as to receive more photons (i.e., energy) while reducing reflection of the incident light.

A junction diffusion step: at a high temperature, boron tribromide is diffused to the wafer surfaces to form a p-type layer, and further form PN junctions in the wafer.

An etching step: the p-type layer at the back side and the edges of the wafer formed in the junction diffusion step is etched using an acid solution of a certain concentration. In the meantime, impurities, for example, borosilicate glass, on the wafer surfaces formed during the junction diffusion process are removed as well.

A tunnel oxide layer and multicrystalline silicon layer preparing step: in low pressure chemical vapor deposition device, an ultrathin silicon dioxide layer is formed on the back side of the wafer by thermal oxidation, which has a thickness of about 1 nm-2 nm (e.g. 1.5 nm), and then, a multicrystalline silicon layer mixed with an amorphous silicon phase and a microcrystalline silicon phase is formed on the silicon dioxide layer, with a thickness of about 100 nm-200 nm (e.g. 150 nm).

An ion implantation step: phosphorus atoms are implanted into the multicrystalline silicon layer in an ion implantation manner.

An annealing step: the implanted phosphorus atoms are activated by a high temperature annealing process, when the amorphous phase and the microcrystalline phase in the multicrystalline silicon layer are converted into a multicrystalline phase.

An optional cleaning step: a chemical solution may be used optionally to clean the wafer surfaces.

A coating step: a film for passivation, for example, aluminum oxide film, is deposited over the wafer surfaces, using an atom layer deposition (ALD) method, and then, a further film is deposited on the front and back sides of the wafer by plasma enhanced chemical vapor deposition (PECVD), to reduce reflection and protect the film for passivation at the front side of the wafer while performing passivation at the back side, and the further film may be a silicon nitride film.

The pretreatment step of the method according to the present disclosure is described above, and other steps thereof will be described below.

A screen-printing step: upon completion of the above process steps, photogenerated positive and negative carriers are generated, and then, it is required to collect the photogenerated carriers. A precious metal paste (e.g. silver paste, aluminum paste or the like) may be printed, for example, by screen-printing or the like, onto the pretreated wafer according to a particular solar cell metalizing pattern.

A sintering and curing step: the screen-printed wafer is sintered and cured at a high temperature, to achieve efficient ohmic contact and further form a solar cell.

A scribing and dividing step: the entire sheet of the sintered solar cell is subjected to laser scribing and dividing into a plurality of strips. Of course, the scribing according to the present disclosure may be any appropriate physical or chemical scribing, for example, laser scribing. Specifically, the sintered solar cells are transferred to a detection position for appearance inspection, and the solar cells with a good appearance are subjected to visual positioning while those solar cells with a poor appearance are automatically shunted to a NG (not good) position. A multi-track scriber & buffer, or a preset buffer-stack area may be provided according to the production pace, to accomplish a continuous operation. In addition, parameters of the laser device may also be set according to the optimum scribing and dividing effect, to obtain a quick scribing speed, a narrow heat-affected zone and a narrow scribing line width, better uniformity, a predetermined scribing depth, and the like. Subsequent to automatic scribing, dividing the solar at the scribing positions by an automatic dividing mechanism of the laser scribing machine, then forming a plurality of solar cell strips. It is worth noting that, in order to avoid leakage current caused by the damaged PN junctions in the scribing and dividing process, a surface away from the PN junction side is preferably selected as a laser scribing surface, and therefore, a separate 180-degree reversing device may be further provided to adjust the orientation of the front and back sides of the cell.

A post-treatment step: the post-treatment step may include:

A testing and sorting step: the solar cell strips may enter sequentially into testing units, for example, including an electrical performance (IV) testing unit, an electroluminescence (EL) testing unit, an appearance visual (VI) testing unit, and the like, to implement testing and sorting on individual cell strips.

Alternatively, color sorting may be performed for the solar cell strips after the testing and sorting step.

Figure 3:
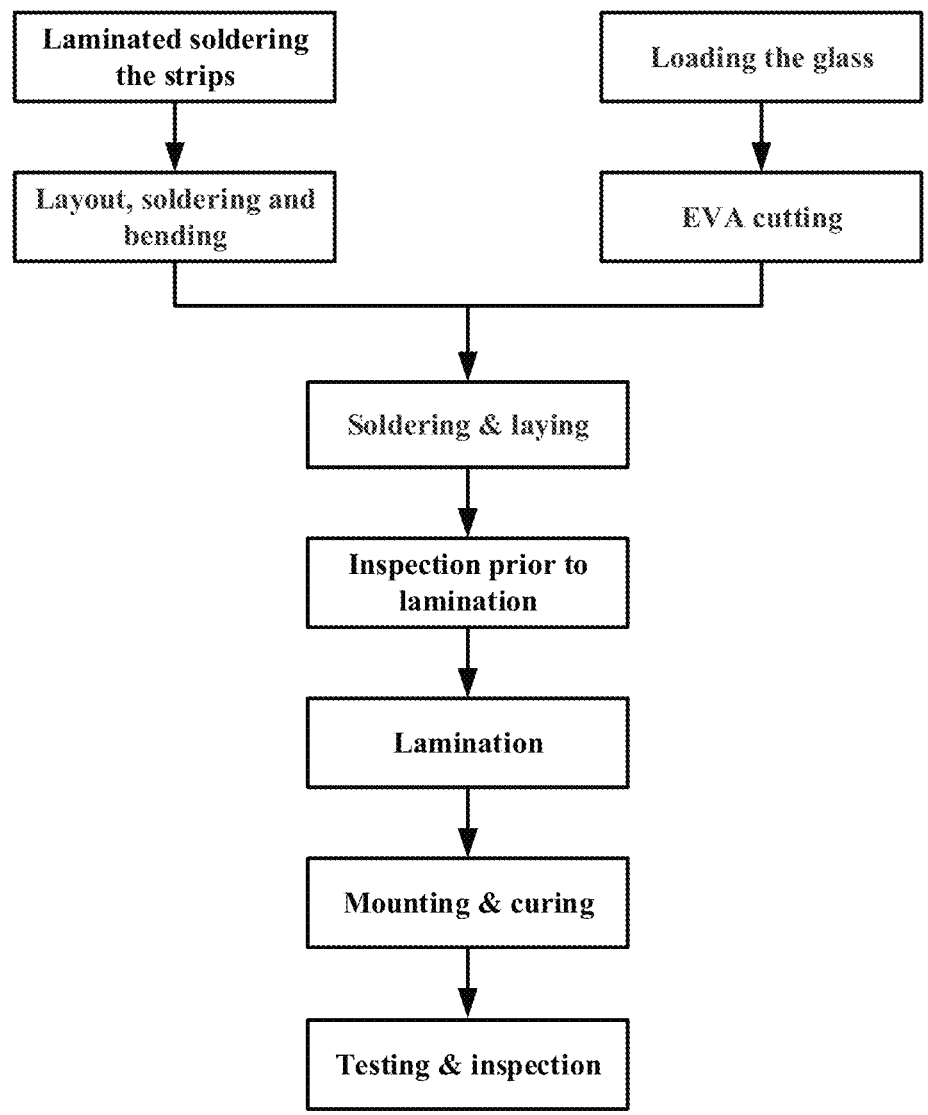
FIG. 3 illustrates a method of manufacturing a shingled solar cell module according to a preferable embodiment of the present disclosure.

Subsequent to the above steps, the solar cell strips having been tested and sorted can be packed and stored according to different grades. After solar cell strips are manufactured using the method according to the present disclosure, shingled solar cell modules can be obtained by assembling them in a shingling process. FIG. 3 illustrates a method of manufacturing solar modules according to a preferable embodiment of the present disclosure, which mainly includes steps of:

receiving solar cell strips manufactured with the method according to the embodiment as described above; and manufacturing shingled solar cell modules from the solar cell strips in a shingling process.

Specifically, as shown in FIG. 3, upon receiving the solar cell strips which have been scribed, split cut, tested and sorted, a shingled solar cell module production plant can directly feed the solar cell strips according to their grades, thereby completing manufacturing and packaging of the shingled solar cell modules. Taking a single glass metal frame assembly as an example, the method includes, for example, laminated soldering (soldering lead wires, bus bars and the like), adhesive film and backplane laying (EVA/TPT laying), inspection prior to lamination (including, for example, EL inspection, VI inspection, and the like), lamination, mounting and curing (including, for example, mounting a frame, mounting a junction box, curing, and the like), testing inspection (including, for example, an IV testing, an EL testing, an appearance testing, and the like). It would be appreciated that the process of manufacturing typical shingled solar cell modules described above is only as an example, and the method according to the present disclosure is also applicable to manufacture other shingled solar cell modules.

Figure 4:
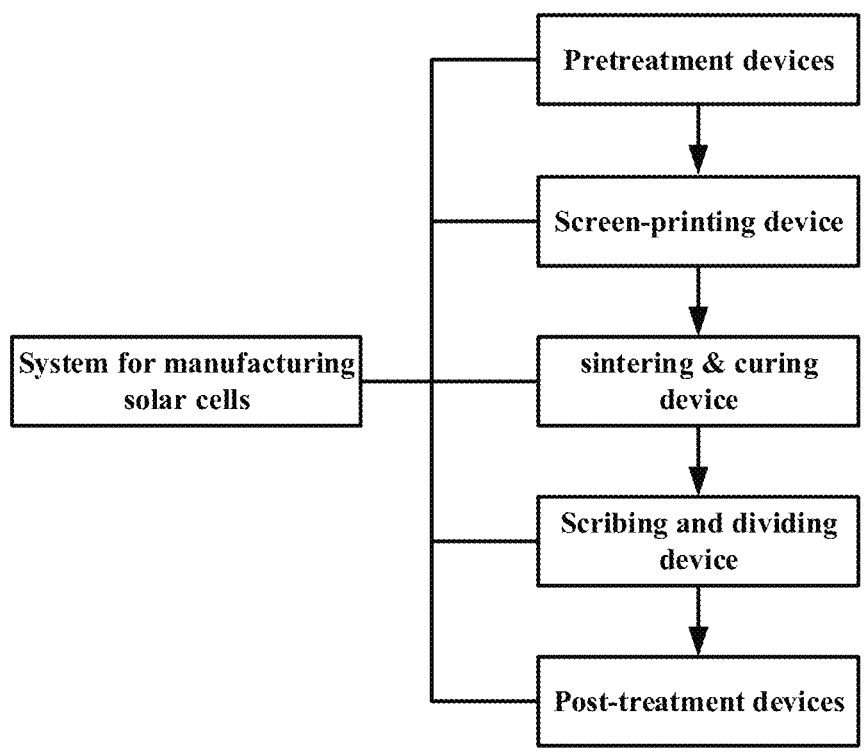
FIG. 4 illustrates a system for manufacturing a solar cell according to a preferable embodiment of the present disclosure.

FIG. 4 illustrates a system for manufacturing solar cells according to a preferable embodiment of the present disclosure. As shown, the system mainly includes pretreatment devices, a screen-printing device, a sintering and curing device, a scribing and dividing device and post-treatment devices. Wherein, for different types of solar cells, the devices may include different pretreatment devices, and for a typical cell, the pretreatment devices mainly include the following devices.

Texturization device is provided for texturizing the surfaces of a monocrystalline/multicrystalline silicon wafer to obtain a good textured structure and thus increase the surface area of the wafer, so as to receive more photons (energy) while reducing reflection of the incident light.

Junction diffusion device is provided for receiving the wafer output by the texturization device, and obtaining phosphorus atoms through reaction of, for example, phosphorus oxychloride with the wafer. Over a period of time, the phosphorus atoms enter into the surfaces of the wafer and form an interface between an n-type semiconductor and a p-type semiconductor, by means of permeation and diffusion into the wafer via gaps between silicon atoms, or by means of ion implantation, the junction diffusion procedure is accomplished, thereby converting the light energy into the electric energy. It would be appreciated that other types of junction-making are also feasible.

Given that a short circuit channel is formed by junction diffusion at the wafer edges, photogenerated electrons collected at the front side flow along the area at the edges where phosphorous is diffused to the back side, causing short circuit. Therefore, it is required to remove the PN junctions at the edges by etching, for example, plasma etching, so as to avoid short circuit at the edges.

Coating device is provided. In order to reduce surface reflection of the wafer and improve the conversion efficiency, it is required to deposit one or more layers of silicon nitride anti-reflection film on a surface at one side of the wafer, and the anti-reflection film can be prepared by, for example, plasma enhanced chemical vapor deposition (PE-VCD) procedure. In order to achieve a good passivation effect, a back passivation film may be deposited on the opposite surface at the other side of the cell to reduce the recombination of carriers.

The above pretreatment devices are described in connection with the process of manufacturing typical solar cells. It would be appreciated that other corresponding pretreatment devices may be employed as substitutes, for other p-types, n-types, and other types of cells, for example, an ordinary mono/multicrystalline silicon cell, a passivated emitter rear contact (PERC) cell, a heterojunction (HJT) cell, a tunnel oxide passivated contact (TopCon) cell or the like. For example, as shown in FIG. 2B, the pretreatment devices involved in a manufacturing process of the heterojunction cell mainly include:

Texturization device is provided for texturizing the surfaces of the monocrystalline/multicrystalline silicon wafer to obtain a good textured structure and thus increase the surface area of the wafer, so as to receive more photons while reducing reflection of the incident light.

Coating device is provided for receiving the wafer output by the texturization device, depositing amorphous silicon on both surfaces of the wafer, and depositing a transparent conductive oxide (TCO) film on the amorphous silicon surfaces.

The pretreatment devices involved in a preparation process of a tunnel oxide passivated contact (TopCon) cell, as shown in FIG. 2C, mainly include:

Texturization device is provided for texturizing the surfaces of the monocrystalline/multicrystalline silicon wafer to obtain a good textured structure and thus increase the surface area of the wafer, so as to receive more photons (i.e., energy) while reducing reflection of the incident light.

Junction diffusion device is provided for receiving the wafer output by the texturization device, diffusion, at a high temperature, boron tribromide into the wafer surfaces to form a p-type layer, and further forming PN junctions in the wafer.

Etching device is provided for receiving the wafer output by the junction diffusion device, and etching the p-type layer at the back side and the edges of the wafer formed in the junction diffusion step, using an acid solution of a certain concentration, while removing impurities, for example, borosilicate glass, on the wafer surfaces formed during the junction diffusion process.

A tunnel oxide layer and multicrystalline silicon layer preparing device is provided for receiving the wafer output by the etching device, forming an ultrathin silicon dioxide layer on the back side of the wafer by thermal oxidation, which has a thickness of about 1 nm-2 nm (e.g. 1.5 nm), and then forming a multicrystalline silicon layer mixed with an amorphous phase and a microcrystalline phase on the silicon dioxide layer, which has a thickness of about 100 nm-200 nm (e.g. 150 nm).

Ion implanting device is provided for receiving the wafer output by the tunnel oxide layer and multicrystalline silicon layer preparing device, and implanting phosphorus atoms into the multicrystalline silicon layer in an ion implantation manner.

Annealing device is provided for receiving the wafer output by the ion implanting device, activating the implanted phosphorus atoms by a high temperature annealing process, while the amorphous phase and the microcrystalline phase in the multicrystalline silicon layer are converted into a multicrystalline phase.

Coating device is provided for receiving the wafer output by the annealing device, depositing a film for passivation, for example, aluminum oxide film, over the wafer surfaces, using an atom layer deposition (ALD) method, and then depositing, during preparation, a further film over the front and back sides of the wafer by plasma enhanced chemical vapor deposition (PECVD), to reduce reflection and protect the film for passivation at the front side of the wafer when performing passivation at the rear side, and the further film may be a silicon nitride film.

The pretreatment devices for implementing the method according to the present disclosure are described above, and other devices thereof will be described below.

A screen-printing device is provided for receiving the wafer output by the pretreatment devices. Having been processed by the above device, the wafer can generate photogenerated positive and negative carriers, and then, it is required to collect the photogenerated carriers. A precious metal paste (e.g. silver paste, aluminum paste or the like) may be printed, for example, by screen-printing or the like, onto the pretreated wafer according to a particular solar cell metalizing pattern.

A sintering and curing device is provided for receiving the wafer output by the screen-printing device, and sintering and curing the screen-printed wafer at a high temperature, to achieve efficient ohmic contact and further form a solar cell.

A scribing and dividing device is provided for receiving the wafer output by the sintering and curing device, and laser scribing and dividing the entire sheet of the sintered solar cell into a plurality of strips. Of course, the scribing according to the present disclosure may be any appropriate physical or chemical scribing, for example, laser scribing. Specifically, the sintered solar cells go to a detection position for appearance inspection, and the OK cells with a good appearance inspection result are subjected to visual positioning while those cells with a poor appearance inspection result are automatically shunted to a NG (not good) position. A multi-track scriber & buffer, or a preset buffer-stack area may be provided according to the production pace, to accomplish a continuous operation. In addition, parameters of the laser device may also be set according to the optimum scribing and dividing effect, to obtain a quick scribing speed, a narrow heat-affected zone and a narrow scribing line width, better uniformity, a predetermined scribing depth, and the like. Subsequent to automatic scribing, dividing the solar cell at the scribing positions by an automatic dividing mechanism of the laser scribing machine, then forming a plurality of solar cell strips. It is worth noting that, in order to avoid leakage current caused by the damaged PN junctions in the scribing and dividing process, a surface away from the PN junction side is preferably selected as a laser scribing surface, and therefore, a separate 180-degree reversing device may be further provided to adjust the orientation of the front and back sides of the cell.

The post-treatment devices may include:

A testing and sorting device is provided. The solar cell strips may enter sequentially into testing units, for example, including an electrical performance (IV) testing unit, an electroluminescence (EL) testing unit, an appearance visual (VI) testing unit, and the like, to implement testing and sorting on individual cell strips.

Alternatively, color sorting device may include appearance visual (VI) testing device and color sorting device. From the above embodiments, it can be obtained that the method of manufacturing solar cells and shingled solar cell modules, and the device for manufacturing the solar cells according to the present disclosure involve performing scribing and dividing in the cell manufacturing process, then testing and sorting the cell strips, and the module production plant can performing shingling assembling directly after receiving the cell strips in the module manufacturing process. Hence, the method can accomplish a smooth flow of manufacturing the solar cells and the shingled solar cell modules, and reduce repeated processing steps.

The protection scope of the present disclosure is only defined by the appended claims. Given the teaching of the present disclosure, those skilled in the art will envision that the structure disclosed herein can be replaced by feasible substitutes, and the embodiments disclosed therein can be combined to form new embodiments which likewise fall within the scope of the appended claims.

What is claimed is:

1. A method of manufacturing a solar cell comprising:
   pretreating a wafer, by:
   texturing one or more surfaces of the wafer;
   diffusing a p-type layer on a front side of the wafer to form PN junctions in the wafer;
   removing the p-type layer at a back side and edges of the wafer and impurities on surfaces of the wafer formed during the junction diffusion by etching;
   forming a silicon dioxide layer on the back side of the wafer;
   forming a multicrystalline silicon layer on the silicon dioxide layer;
   implanting phosphorus atoms into the multicrystalline silicon layer by ion implanting;
   activating the phosphorus atoms implanted by annealing; and
   depositing a first layer of film on the front side of the wafer, and a second layer of film on the front and back sides of the wafer;
   screen-printing a precious metal paste on a surface of the pretreated wafer;
   sintering and curing the screen-printed wafer to form a solar cell;
   performing laser scribing at a side of the solar cell away from a surface of the solar cell having the PN junctions and dividing the solar cell into a plurality of solar cell strips; and
   performing testing, appearance inspection, and sorting on the plurality of solar cell strips respectively in the cell manufacturing process, wherein the sorting of the plurality of solar cell strips is based upon a result of the testing.

2. The method according to claim 1, characterized in that the testing comprises an electrical performance testing and an electroluminescence testing.

3. The method according to claim 1, characterized in that the appearance inspection comprises an appearance visual testing and color sorting.

4. The method according to claim 1, wherein sorting the plurality of solar cell strips comprises sorting the solar cell strips into a plurality of different grades, based upon the result of the testing.

5. A method of manufacturing a shingled solar cell module, characterized by comprising steps of:
   receiving the solar cell strips manufactured with the method according to claim 1; and
   forming, by a shingling process, the shingled solar cell module from the solar cell strips.

* * * * *